United States Patent
Ishigaki et al.

(10) Patent No.: US 11,998,992 B2
(45) Date of Patent: Jun. 4, 2024

(54) SURFACE COATED CUTTING TOOL HAVING HARD COATING LAYER EXHIBITING EXCELLENT CHIPPING RESISTANCE

(71) Applicant: MITSUBISHI MATERIALS CORPORATION, Tokyo (JP)

(72) Inventors: Takuya Ishigaki, Tsukuba (JP); Kousuke Yanagisawa, Naka (JP); Hiroki Nakamura, Joso (JP); Hisashi Honma, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 681 days.

(21) Appl. No.: 17/279,429

(22) PCT Filed: Sep. 27, 2019

(86) PCT No.: PCT/JP2019/038092
§ 371 (c)(1),
(2) Date: Mar. 24, 2021

(87) PCT Pub. No.: WO2020/067402
PCT Pub. Date: Apr. 2, 2020

(65) Prior Publication Data
US 2021/0402486 A1 Dec. 30, 2021

(30) Foreign Application Priority Data

Sep. 28, 2018 (JP) .................................. 2018-186044
Aug. 8, 2019 (JP) .................................. 2019-146495

(51) Int. Cl.
| B23B 27/14 | (2006.01) |
| B23C 5/16 | (2006.01) |
(Continued)

(52) U.S. Cl.
CPC ................ *B23B 27/14* (2013.01); *B23C 5/16* (2013.01); *C23C 16/308* (2013.01); *C23C 16/34* (2013.01);
(Continued)

(58) Field of Classification Search
None
See application file for complete search history.

(56) References Cited

U.S. PATENT DOCUMENTS

| 2016/0333473 A1 | 11/2016 | Stiens et al. |
| 2017/0298505 A1 | 10/2017 | Tatsuoka et al. |
| 2018/0311742 A1 | 11/2018 | Tatsuoka et al. |

FOREIGN PATENT DOCUMENTS

| EP | 3202515 A1 | 8/2017 | |
| JP | 2015163423 A | * 9/2015 | ............. C23C 16/34 |

(Continued)

OTHER PUBLICATIONS

Japanese Notice of Allowance dated Jan. 18, 2023 for the corresponding Japanese Patent Application No. 2019-146495 (6 pages including English translation).

(Continued)

*Primary Examiner* — Seth Dumbris
(74) *Attorney, Agent, or Firm* — Leason Ellis LLP; Melvin C. Garner; Mitsuhiro Haraguchi

(57) ABSTRACT

A surface coated cutting tool comprises a tool body. A TiAlCN layer having an average layer thickness of 2.0 to 20.0 μm and represented by $(Ti_{(1-x)}Al_x)(C_yN_{(1-y)})$ is provided on the surface of the tool body and has an average content ratio $x_{avg}$ of Al and an average content ratio $y_{avg}$ of C that satisfy $0.60 \leq x_{avg} \leq 0.95$ and $0.00 \leq y_{avg} \leq 0.05$, an area ratio occupied by crystal grains having an NaCl-type face-centered cubic structure that satisfies 90 area % or more, and crystal grains satisfying $0.01\ \mu m < d \leq 0.20\ \mu m$ in 10 to 40 area (Continued)

%. An average maximum length in a direction parallel to the surface of the tool body in each region in which the crystal grains having d of 0.01 µm<d≤0.20 µm are adjacent and connected to each other in the upper layer side region is 5.0 µm or less.

4 Claims, 1 Drawing Sheet

(51) Int. Cl.
    *C23C 16/30*     (2006.01)
    *C23C 16/34*     (2006.01)
    *C23C 16/36*     (2006.01)
    *C23C 16/40*     (2006.01)
    *C23C 30/00*     (2006.01)

(52) U.S. Cl.
    CPC ............ *C23C 16/36* (2013.01); *C23C 16/403* (2013.01); *C23C 30/005* (2013.01); *B23B 2224/28* (2013.01); *B23B 2224/32* (2013.01)

(56) References Cited

FOREIGN PATENT DOCUMENTS

| | | | |
|---|---|---|---|
| JP | 2015163423 | A | 9/2015 |
| JP | 2016-003368 | A | 1/2016 |
| JP | 2016030319 | A | 3/2016 |
| JP | 2016-064471 | A | 4/2016 |
| JP | 2016049573 | A | 4/2016 |
| JP | 2017-508632 | A | 3/2017 |
| JP | 2017-080883 | A | 5/2017 |
| JP | 2017113834 | A | 6/2017 |
| JP | 2018-114611 | A | 7/2018 |
| JP | 2018161736 | A * | 10/2018 |
| WO | 2016052479 | A1 | 4/2016 |
| WO | WO-2017/016826 | A1 | 2/2017 |

OTHER PUBLICATIONS

International Search Report dated Nov. 12, 2019 for the corresponding PCT International Patent Application No. PCT/JP2019/038092.
European Search Report dated Mar. 10, 2022 for the corresponding European Patent Application No. 19866532.5, 9 pages.

* cited by examiner

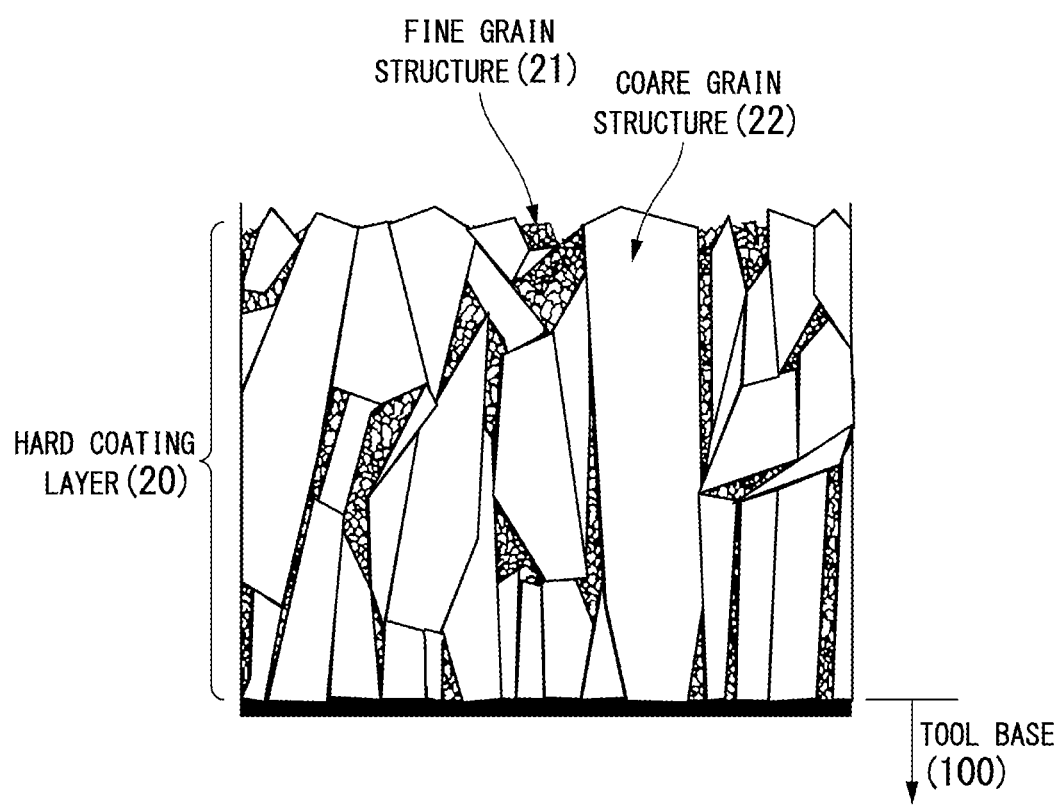

SURFACE COATED CUTTING TOOL HAVING HARD COATING LAYER EXHIBITING EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2019/038092 filed on Sep. 27, 2019 and claims the benefit of priority to Japanese Patent Applications No. 2018-186044, filed Sep. 28, 2018 and No. 2019-146495 filed Aug. 8, 2019, all of which are incorporated herein by reference in their entirety. The International Application was published in Japanese on Apr. 2, 2020 as International Publication No. WO/2020/067402 under PCT Article 21(2).

FIELD OF THE INVENTION

The present invention relates to a surface coated cutting tool (hereinafter, may be referred to as a coated tool) that exhibits excellent cutting performance over a long period of time because a hard coating layer has excellent chipping resistance even when used for high-speed intermittent cutting of cast iron, alloy steel, or the like.

BACKGROUND OF THE INVENTION

In the related art, there are coated tools obtained by coating, as a hard coating layer, a Ti—Al-based complex carbonitride layer on a surface of a tool body (hereinafter, these are collectively referred to as a tool body) composed of a tungsten carbide (hereinafter, indicated by WC)-based cemented carbide, a titanium carbonitride (hereinafter, indicated by TiCN)-based cermet, or a cubic boron nitride (hereinafter, indicated by cBN)-based ultrahigh-pressure sintered body by a physical vapor deposition method, and these are known to exhibit excellent wear resistance.

However, in the related art, although the coated tool coated with the Ti—Al-based complex carbonitride layer has relatively excellent wear resistance, abnormal wear such as chipping is likely to occur when used under high-speed intermittent cutting conditions. Therefore, various proposals have been made for improving lubricity of the hard coating layer.

For example, PCT International Publication No. WO2017/016826 describes coated tool, which has $Ti_{1-x}Al_xC_yN_z$ layer ($0.40 \leq x \leq 0.95$, $0 \leq y \leq 0.10$, $0.85 \leq z \leq 1.15$) which is coated on a tool body by CVD and is a hard film having a thickness of 1 to 16 μm and having crystal grains having an fcc structure of 85 volume % or more, and in which $Ti_{1-o}Al_oC_pN_q$ ($0.95 \leq o \leq 1.00$, $0 \leq p \leq 0.10$, $0.85 \leq q \leq 1.15$, $o-x \geq 0.05$) having MN of a hexagonal structure is precipitated at grain boundaries of the layer.

Further, for example, Japanese Unexamined Patent Application, First Publication No. 2016-3368 describes a coated tool having a hard film including a plurality of crystal grains and an amorphous phase between the crystal grains, in which the crystal grains each have a structure in which a $Ti_{1-x}Al_xN$ layer having an fcc structure and a $Ti_{1-y}Al_yN$ layer having an fcc structure are alternately laminated, an Al composition ratio x of the $Ti_{1-x}Al_xN$ layer satisfies a relationship of $0 \leq x < 1$, an Al composition ratio y of the $Ti_{1-y}Al_yN$ layer satisfies a relationship of $0 \leq y \leq 1$, the Al composition ratio x and the Al composition ratio y satisfy a relationship of $(y-x) \geq 0.2$, and the amorphous phase includes carbide, nitride, or carbonitride of at least one of Ti and Al.

CITATION LIST

Patent Documents

Patent Document 1

PCT International Publication No. WO2017/016826

Patent Document 2

Japanese Unexamined Patent Application, First Publication No. 2016-3368

Technical Problem

The hard film described in each of PCT International Publication No. WO2017/016826 and Japanese Unexamined Patent Application, First Publication No. 2016-3368 has hexagonal and amorphous phases, which generally reduce the strength, at the grain boundaries. Accordingly, when the hard film is used for high-speed intermittent cutting with a higher load, chipping is likely to occur, and thus it is difficult to achieve satisfactory cutting performance.

Therefore, an object of the present invention is to provide a cutting tool that exhibits excellent cutting performance over a long period of time because a hard coating layer has excellent chipping resistance even when used for high-speed intermittent cutting of cast iron, alloy steel, or the like.

SUMMARY OF THE INVENTION

Solution to Problem

The present inventors have made a diligent study on improving chipping resistance of a complex nitride layer or a complex carbonitride layer (hereinafter, the complex nitride layer or the complex carbonitride layer is also referred to as a TiAlCN layer) of Ti and Al as a hard coating layer, and thus, the present inventors have obtained new findings that if moderately small crystal grains (microcrystal grains) exist between crystal grains having a large grain size, propagation of cracks during cutting is hindered while maintaining wear resistance provided by the crystal grains having a large grain size, and the chipping resistance is improved in high-speed intermittent cutting of cast iron, alloy steel, or the like.

The present invention is based on these findings.

"(1) A surface coated cutting tool including: a tool body; and a hard coating layer provided on a surface of the tool body,
  wherein (a) the hard coating layer includes at least a complex nitride layer or a complex carbonitride layer of Ti and Al having an average layer thickness of 2.0 to 20.0 μm,
  (b) when the complex nitride layer or the complex carbonitride layer is represented by a composition formula: $(Ti_{(1-x)}Al_x)(CyN_{(1-y)})$, an average content ratio $x_{avg}$ of Al with respect to in a total amount of Ti and Al and an average content ratio $y_{avg}$ of C with respect to in a total amount of C and N (where, each of $x_{avg}$ and $y_{avg}$ is an atomic ratio) each satisfy $0.60 \leq x_{avg} \leq 0.95$ and $0.00 \leq y_{avg} \leq 0.05$, (c) when observing a vertical cross section of each of the complex nitride layer or the complex carbonitride layer, an area ratio occupied by crystal grains having an NaCl-type face-centered cubic structure of a complex nitride or a complex carbonitride satisfies 90 area % or more, (d) when the complex nitride layer or the complex carbonitride layer is bisected into an upper layer side and a lower layer side in a layer thickness direction, in a region on the upper layer side, in a case where a crystal grain size d of each of the crystal grains having the NaCl-type face-centered cubic structure is obtained, crystal grains having the crystal grain size d of 0.01 μm<d≤0.20 μm exist in an area ratio of 10 to 40 area % with respect to an entire area of the complex nitride layer or the complex carbonitride layer in the region on the upper layer side, and (e) in the region on the bisected upper layer side, an average value L(dsum) of a maximum length L in a direction parallel to the surface of the tool body in each region in which the crystal grains having the NaCl-type face-centered cubic structure and each crystal grain size d of 0.01 μm<d≤0.20 μm are adjacent and connected to each other satisfies L(dsum)≤5.0 μm.

(2) The surface coated cutting tool according to (1), wherein in the complex nitride layer or the complex carbonitride layer, the area ratio occupied by the crystal grains having the NaCl-type face-centered cubic structure is 95 area % or more.

(3) The surface coated cutting tool according to (1) or (2), wherein among the crystal grains constituting the complex nitride layer or the complex carbonitride layer, in crystal grains having the NaCl-type face-centered cubic structure and each crystal grain size d of 0.20 μm<d, crystal grains having an aspect ratio A of 2 to 20 exist in an area ratio of 30 area % or more with respect to the entire area of the complex nitride layer or the complex carbonitride layer.

(4) The surface coated cutting tool according to any one of (1) to (3), wherein when an inclination angle frequency distribution is obtained by measuring an inclination angle between a normal of a plane {111} of the crystal grain having the NaCl-type face-centered cubic structure among the crystal grains constituting the complex nitride layer or the complex carbonitride layer and a direction perpendicular to the surface of the tool body, a highest peak exists in an inclination angle division in a range of 0° to 12° and a total of frequencies existing in the range of 0° to 12° is 45% or more of total frequencies in the inclination angle frequency distribution."

Advantageous Effects of Invention

In the coated tool of the present invention, the hard coating layer has excellent chipping resistance and exhibits excellent cutting performance over a long period of use.

BRIEF DESCRIPTION OF THE DRAWING(S)

The FIGURE is a schematic view of a vertical cross section (cross section perpendicular to a surface of a tool body) of a hard coating layer of the present invention, in which a crystal grain size d of 0.01 μm<d≤0.20 μm is referred to as a fine grain structure, and the crystal grain size d of 0.20 μm≤d is referred to as a coarse grain structure. Shape and dimensions of each structure are not a copy of an actual structure.

DETAILED DESCRIPTION OF THE INVENTION

Hereinafter, a cutting tool of the present invention will be described in more detail. Moreover, in the present specification and claims, when a numerical range is expressed by using "to", the range includes numerical values of an upper limit and a lower limit. A unit of the numerical value of the lower limit is the same as that of the numerical value of the upper limit.

Average Layer Thickness of Hard Coating Layer 20

A hard coating layer 20 of the present invention includes at least a complex nitride layer or a complex carbonitride layer of Ti and Al represented by a composition formula: $(Ti_{(1-x)}Al_x)(C_yN_{(1-y)})$. The TiAlCN layer has high hardness and excellent wear resistance. In particular, when an average layer thickness thereof is 2.0 to 20.0 μm, effects thereof are remarkably exhibited. The reason is that if the average layer thickness is less than 2.0 μm, sufficient wear resistance cannot be ensured over a long period of use because a layer thickness is thin, while if the average layer thickness exceeds 20.0 μm, crystal grains of the TiAlCN layer are likely to be coarsened, and chipping is likely to occur. More preferably, the average layer thickness is 4.0 to 12.0 μm.

Composition of TiAlCN Layer:

When the TiAlCN layer of the present invention is represented by the composition formula: $(Ti_{(1-x)}Al_x)(C_yN_{(1-y)})$, a composition is controlled so that an average content ratio $x_{avg}$ of Al with respect to a total amount of Ti and Al and an average content ratio $y_{avg}$ of C with respect to a total amount of C and N (where, each of $x_{avg}$ and $y_{avg}$ is an atomic ratio) each satisfy $0.60 \leq x_{avg} \leq 0.95$ and $0.00 \leq y_{avg} \leq 0.05$.

The reason is that if the average content ratio $x_{avg}$ of Al is less than 0.60, the TiAlCN layer is inferior in oxidation resistance, and thus, the wear resistance is not sufficient when subjected to high-speed intermittent cutting of alloy steel or the like. Meanwhile, when the average content ratio $x_{avg}$ of Al exceeds 0.95, a precipitation amount of hexagonal crystals inferior in hardness increases and the hardness decreases, and thus, the wear resistance decreases.

Further, the reason why the average content ratio $y_{avg}$ of C components contained in the TiAlCN layer is set to $0.00 \leq y_{avg} \leq 0.05$ is because even if C is contained, the hardness can be improved if the amount of C is small, and when the average content ratio thereof is in a range of 0.05 or less, it is possible to improve the hardness while maintaining the chipping resistance. The complex nitride layer or complex carbonitride layer (TiAlCN layer) of Ti and Al mentioned here does not impair the above-mentioned effects of the invention even if it has a small amount of unavoidable impurities such as O or Cl.

Here, the average content ratio $x_{avg}$ of Al of the TiAlCN layer is obtained by irradiating a sample having a polished cross section with an electron beam from a vertical cross section side using Auger Electron Spectroscopy (AES) and averaging analysis results of Auger electrons obtained by performing a five-line analysis in a layer thickness direction. Further, the average content ratio $y_{avg}$ of C can be obtained by Secondary-Ion-Mass-Spectroscopic (SIMS). That is, in the sample of which a sample surface is polished, an area of 70 μm×70 μm from a surface side of the TiAlCN layer is irradiated with the ion beam, and an area analysis by the ion beam and etching by ion beam sputtering are alternately repeated to measure a concentration in a depth direction. First, an average of data is obtained by measuring a depth of at least 0.5 μm at a pitch of 0.1 μm or less from a portion of the TiAlCN layer that has penetrated 0.5 μm or more in the depth direction of the layer. Further, the results obtained by repeatedly calculating this at least five portions on the sample surface are averaged and obtained as the average content ratio $y_{avg}$ of C.

Area Ratio of Crystal Grains Having NaCl-Type Face-Centered Cubic Crystal Structure in TiAlCN layer:

It is necessary for the TiAlCN layer to have crystal grains (sometimes referred to as cubic crystal grains) having a NaCl-type face-centered cubic crystal structure, and when a vertical cross section of the layer is observed, preferably, an area ratio thereof is at least 90 area % or more. Therefore, the area ratio of the crystal grains having a high-hardness NaCl-type face-centered cubic crystal structure increases, and hardness increases. Further, this area ratio is more preferably 95 area % or more and may be 100 area %.

When TiAlCN Layer is Bisected into Upper Layer Side and Lower Layer Side in Layer Thickness Direction, Grain Size and Area Ratio of Crystal Grains Having NaCl-Type Face-Centered Cubic Crystal Structure in Region on Upper Layer Side:

When the TiAlCN layer is bisected into upper layer side and lower layer side in the layer thickness direction, it is preferable that microcrystals 21 exist in which a grain size d of each of crystal grains having the NaCl-type face-centered cubic crystal structure in a region on the upper layer side is 0.01 μm<d≤0.20 μm. The reason is that the microcrystals 21 exist between large crystal grains 22 of 0.20 μm<d, and when a crystal grain size of the microcrystal 21 is 0.01 μm or less, the grain size is too small, and when the crystal grain size exceeds 0.20 μm, the crystal grains become large and the area of the crystal grain boundaries decrease, and thus the chipping resistance is not improved.

Further, preferably, the area ratio of the microcrystal 21 is 10 to 40 area % in the region on the upper layer side of the TiAlCN layer. The reason is that if the area ratio is less than 10 area %, the number of microcrystals 21 is reduced and crack propagation is not sufficiently inhibited, while if the area ratio exceeds 40 area %, detachment of microcrystal grains 21 during cutting operation becomes remarkable, and thus, the chipping resistance is not improved in either case.

In Region of Upper Layer Side when TiAlCN Layer is Bisected into Upper Layer Side and Lower Layer Side in Layer Thickness Direction, Average Value L(Dsum) of Maximum Length L in Direction Parallel to Surface of Tool Body 100 in Each Region in which Crystal Grains 21 having NaCl-type face-centered cubic crystal structure and each crystal grain size d of 0.01 μm<d≤0.20 μm are Adjacent and Connected to Each Other:

Preferably, in the region of the upper layer side when the TiAlCN layer is bisected into the upper layer side and lower layer side in the layer thickness direction, the average value L(dsum) of the maximum length L in the direction parallel to the surface of the tool body 100 in each region (a region formed only by crystal grains 21 having the grain size d of 0.01 μm<d≤0.20 μm) in which crystal grains having the crystal grain size d of 0.01 μm<d≤0.20 μm are adjacent and connected to each other satisfies 0.2 μm<L(dsum)≤5.0 μm. The reason is that if the L (dsum) exceeds 5.0 μm, the microcrystal grains 21 exist in layers in the direction parallel to the surface of the tool body 100, and improvement in the chipping resistance cannot be expected, and even if the L (dsum) is less than 0.2 μm, aggregation of the microcrystal grains 21 is small or less, and improvement in the chipping resistance cannot be expected. The maximum length L in each region is a maximum length connecting two different points on the grain boundaries of the crystal grains defining the region.

Here, the crystal grain size, the area ratio, and the maximum length L of the crystal grains having a NaCl-type face-centered cubic crystal structure are measured as follows. When the TiAlCN layer is bisected in the upper layer side and the lower layer side in the layer thickness direction, in the vertical cross section of the region on the upper layer side, a length range which is located by 100 μm in the direction parallel to the surface of the tool body 100 and obtained by bisecting the average layer thickness in the layer thickness direction becomes a measurement region. A surface in this measurement region is polished, and the crystal structure of each crystal grain having a NaCl-type face-centered cubic crystal structure is analyzed based on an electron backscatter diffraction image obtained by irradiating this polished surface with an electron beam having an acceleration voltage of 15 kV at an incident angle of 70° with an irradiation current of 1 nA at an interval of 0.01 μm using an electron backscatter diffraction image device. That is, when there is an orientation difference of 5° or more between adjacent measurement points (pixels), that is defined as a grain boundary, and a region surrounded by the grain boundary is defined as one crystal grain. However, a pixel that exists independently with all adjacent pixels and the orientation difference of 5° or more is not regarded as the crystal grain, and a pixel in which two or more pixels are connected is treated as the crystal grain. The crystal grain size is defined as a diameter of a circle that has the same area as the defined crystal grain. Moreover, the area ratio is a ratio of a sum of areas of the crystal grains to an area of the measurement region. Further, in the measurement region, each region in which crystal grains having the crystal grain size d of 0.01 μm<d≤0.20 μm are adjacent and connected to each other is defined, the maximum length L thereof is obtained in each region, and the average value L (dsum) thereof is calculated.

In Crystal Grains 22 Having NaCl-Type Face-Centered Cubic Structure and Grain Size d of 0.20 μm<d in TiAlCN Layer, Area Ratio of Crystal Grains Having Aspect Ratio a of 2 to 20:

When the vertical cross section of the layer is observed, in crystal grains 22 having the NaCl-type face-centered cubic structure and each crystal grain size d of 0.20 μm<d, the crystal grains having the aspect ratio A of 2 to 20 preferably exist in 30 to 90 area % in the area ratio with respect to the entire area of the complex nitride layer or the complex carbonitride layer. The reason for setting this numerical range is that the crystal grains have appropriate aspect ratio A and area ratio, and thus, the wear resistance and chipping resistance of the layer can be improved. That is, if the area ratio of the crystal grains having the aspect ratio A of less than 2 is large, or if the area ratio is lower than 30% even if the aspect ratio A is within the range, a columnar structure is not sufficient. Accordingly, equiaxed crystal grains having a small aspect ratio to falls off, and as a result, it is not possible to exert a sufficient effect of improving the wear resistance. Meanwhile, when the area ratio of the crystal grains having the aspect ratio A exceeding 20 is large, the crystal grains themselves cannot maintain their strength and cannot sufficiently exert effects of improving the chipping resistance. Further, even when the aspect ratio A is within the above range, if the area ratio is too high, toughness of the TiAlCN layer itself is improved, but peeling resistance from a tool body decreases, and as a result, the effect of improving the chipping resistance cannot be exhibited.

When the vertical cross section of the hard coating layer 20 is observed in a region in which a width is 100 μm and a height includes the entire hard coating layer 20 using a scanning electron microscope, by performing observation from a cross-sectional side of a film perpendicular to the surface of the tool body 100 and measuring a particle width w in a direction parallel to the body surface and a particle length 1 in a direction perpendicular to the body surface, the aspect ratio A is calculated by A=1/w.

Frequency Distribution of Inclination Angle Between Normal of Plane {111} which is Crystal Plane of Crystal Grain Having NaCl-Type Face-Centered Cubic Structure in TiAlCN Layer and Direction Perpendicular to Surface of Tool Body 100:

When the inclination angle between the normal of the plane {111} which is the crystal plane of the crystal grain having NaCl-type face-centered cubic structure in the TiAlCN layer and the direction perpendicular to the surface of the tool body 100 is measured and a measurement inclination angle within a range of 0 to 45° with respect to the normal direction is divided into pitches of 0.25° and the frequencies existing in each division are totaled to obtain the inclination angle frequency distribution, preferably, a highest peak exists in an inclination angle division in a range of 0° to 12° and a total of frequencies existing in the range of 0° to 12° occupies a ratio of 45 to 90% of a total frequencies in the inclination angle frequency distribution. The reason is that within this range, an orientation of the crystal grains is aligned in the same direction within a certain range, and thus, the strength of the crystal grain boundaries is improved, and as a result, both wear resistance and chipping resistance are improved. That is, if it is less than 45%, the wear resistance is not improved, and if it exceeds 90%, the chipping resistance cannot be expected to be improved, and as a result, the effect of improving the cutting performance cannot be exhibited.

Here, the inclination angle distribution is obtained as follows.

First, in a state in which the vertical cross section (cross section perpendicular to the surface of the tool body 100) of the hard coating layer 20 including the complex nitride layer or complex carbonitride layer of Ti and Al having a NaCl-type face-centered cubic crystal structure is used as a polished surface, the vertical cross section is set in a lens tube of a field-emission type scanning electron microscope. In the polished surface (cross-section polished surface), a region of 100 μm in a length in the parallel direction to the surface of the tool body 100 and a length equivalent to the layer thickness with respect to the layer thickness in the direction perpendicular to the surface of the tool body 100 is set to the measurement region, with an electron beam with an acceleration voltage of 15 kV at an incident angle of 70° on the polished surface in this measurement region with an irradiation current of 1 nA, each crystal grain having a NaCl-type face-centered cubic structure existing in the measurement range of the cross-section polished surface is irradiated at intervals of 0.01 μm/step, and based on an obtained electron backscatter diffraction image, an inclination angle formed by the normal of the plane {111} which is the crystal plane of the crystal grain with respect to the normal (direction perpendicular to the tool body surface in the cross-section polished surface) of the tool body surface is each measured for each measurement point (point irradiated with an electron beam).

Then, based on this measurement result, among the measured inclination angles, the inclination angles in the range of 0 to 45° are classified for each pitch of 0.25°, the frequencies existing in each division are totaled, and thus the inclination angle frequency distribution is obtained. From the obtained inclination angle frequency distribution, it is confirmed whether or not there is a highest peak of the frequencies existing in the range of 0 to 12°, and a ratio of the frequencies existing in the range of 0 to 12° with respect to the frequencies (total frequencies in the inclination angle frequency distribution) existing in the range of 0 to 45° is obtained. In an inclination angle distribution graph, it is more preferable that the total of the frequencies existing in the range of 0 to 12° is 50% or more of the total frequencies in the inclination angle frequency distribution.

In obtaining the inclination angle frequency distribution, in a case of an ideal random orientation, the inclination angle frequency is normalized so as to be a constant value regardless of the inclination angle formed by the normal direction of a certain crystal plane with respect to the normal direction of the surface of the tool body 100.

Other Layers:

As the hard coating layer 20, the TiAlCN layer of the present invention has sufficient chipping resistance and wear resistance. However, when a lower layer that is composed of one layer or two or more layers of a carbide layer, a nitride layer, a carbonitride layer, a oxycarbide layer and a oxycarbonitride layer of Ti and includes a Ti compound layer having a total average layer thickness of 0.1 to 20.5 μm is provided adjacent to the tool body 100, and/or when a layer including at least an aluminum oxide layer is provided on the TiAlCN layer as an upper layer with a total average layer thickness of 1.0 to 25.5 μm, combined with effects of the layers, it is possible to exhibit further excellent wear resistance and thermal stability.

Here, if the total average layer thickness of the lower layer is less than 0.1 μm, the effect of the lower layer is not sufficiently exhibited, while if the total average layer thickness exceeds 20.5 μm, the crystal grains of the lower layer tend to be coarsened and chipping is likely to occur. Further, when the total average layer thickness of the upper layer including the aluminum oxide layer is less than 1.0 μm, the effect of the upper layer is not sufficiently exhibited, while if the total average layer thickness exceeds 25.5 μm, the crystal grains of the upper layer tend to be coarsened and chipping is likely to occur.

Tool Body 100:

As the tool body 100, any base material known in the related art as the tool body of this type can be used as long as it does not hinder achievement of the object of the present invention. For example, preferably, any one of cemented carbide (WC-based cemented carbide, those that contain WC and Co and further contains carbonitrides such as Ti, Ta, or Nb, or the like), cermet (mainly composed of TiC, TiN, TiCN, or the like), ceramics (titanium carbide, silicon carbide, silicon nitride, aluminum nitride, aluminum oxide, or the like), a cBN sintered body is used. Among these various tool body materials, it is preferable to select the WC-based cemented carbide, cermet (TiCN-based cermet), and cBN sintered body. The reason is that they have an excellent balance between hardness and strength at high temperatures and are excellent as tool bodies for cutting tools.

Film Formation Method (Conditions):

For example, the TiAlCN layer of the present invention can be obtained by supplying, with predetermined phase differences, each of two types of reaction gases (reaction gas (1) and reaction gas (2))) consisting of a gas group A consisting of $NH_3$, $N_2$, and $H_2$, and a gas group B consisting of $AlCl_3$, $TiCl_4$, $N_2$, $C_2H_4$, and $H_2$ to the tool body 100 or at least one or more of a carbide layer, a nitride layer, a carbonitride layer, a oxycarbide layer, and a oxycarbonitride layer of Ti on the tool body 100.

As an example of a gas composition of the reaction gas, the following reaction gas (1) and reaction gas (2) are used and expressed in % as a volume % (the sum of the gas group A and the gas group B is taken as a whole).
Reaction gas (1)
  Gas group A: $NH_3$: 2.0 to 3.0%, $N_2$: 0.0 to 5.0%, $H_2$: 50 to 60%
  Gas group B: $AlCl_3$: 0.60 to 1.00%, $TiCl_4$: 0.10 to 0.40%, $N_2$: 2.0 to 10.0%, $C_2H_4$: 0.0 to 3.0%, $H_2$: remainder
  Reaction atmosphere pressure: 4.5 to 5.0 kPa
  Reaction atmosphere temperature: 650 to 850° C.
  Supply cycle: 4.00 to 30.00 seconds
  Gas supply time per cycle: 0.30 to 0.90 seconds
  Phase difference of supply of gas group A and gas group B: 0.10 to 0.30 seconds
Reaction Gas (2)
  Gas group A: $NH_3$: 0.2 to 0.6%, $N_2$: 0.0 to 5.0%, $H_2$: 50 to 60%
  Gas group B: $AlCl_3$:0.06 to 0.20%, $TiCl_4$: 0.01 to 0.06%, $N_2$:2.0 to 10.0%, $C_2H_4$: 0.0 to 0.5%, $H_2$: remainder
  Reaction atmosphere pressure: 4.5 to 5.0 kPa
  Reaction atmosphere temperature: 650 to 850° C.
  Supply cycle: 4.00 to 30.00 seconds
  Gas supply time per cycle: 0.30 to 0.90 seconds
  Phase difference of supply of gas group A and gas group B: 0.10 to 0.30 seconds
  Phase difference of reaction gas (1) and reaction gas (2): 2.00 to 15.00 seconds

EXAMPLES

Next, an example will be described.

Here, as a specific example of the coated tool of the present invention, an example applied to an insert cutting tool using a WC-based cemented carbide as a tool body will be described. However, the same applies when a TiCN-based cermet or a cBN-based ultrahigh-pressure sintered body is used as the tool body, and the same applies when applied to a drill or an end mill.

Example 1

WC powder, TiC powder, TaC powder, NbC powder, $Cr_3C_2$ powder, and Co powder, each having an average grain size of 1 to 3 μm, were prepared as raw material powders, these raw material powders were blended into a blending composition shown in Table 1, wax was further added to the raw material powders, the powders were mixed in a ball mill in acetone for 24 hours, dried under reduced pressure, and press-molded into a green compact of a predetermined shape at a pressure of 98 MPa, this green compact was vacuum sintered in a vacuum of 5 Pa at a predetermined temperature in a range of 1370 to 1470° C. for 1 hour, and after sintering, tool bodies A to C made of WC-based cemented carbide having an insert shape of ISO standard SEEN1203AFSN were manufactured.

Next, a TiAlCN layer was formed on surfaces of the tool bodies A to C by CVD using a CVD apparatus to obtain the coated tools 1 to 11 of the present invention shown in Table 6.

Film forming conditions are as shown in Tables 2 and 3, but are generally as follows. The notation of % in a gas composition is a volume % (the sum of the gas group A and the gas group B is taken as a whole).
Reaction Gas (1)
  Gas group A: $NH_3$: 2.0 to 3.0%, $N_2$: 0.0 to 5.0%, $H_2$: 50 to 60%
  Gas group B: $AlCl_3$: 0.60 to 1.00%, $TiCl_4$: 0.10 to 0.40%, $N_2$: 2.0 to 10.0%, $C_2H_4$: 0.0 to 3.0%, $H_2$: remainder
  Reaction atmosphere pressure: 4.5 to 5.0 kPa
  Reaction atmosphere temperature: 650 to 850° C.
  Supply cycle: 4.00 to 30.00 seconds
  Gas supply time per cycle: 0.30 to 0.90 seconds
  Phase difference of supply of gas group A and gas group B: 0.10 to 0.30 seconds
Reaction Gas (2)
  Gas group A: $NH_3$: 0.2 to 0.6%, $N_2$: 0.0 to 5.0%, $H_2$: 50 to 60%
  Gas group B: $AlCl_3$: 0.06 to 0.20%, $TiCl_4$: 0.01 to 0.06%, $N_2$: 2.0 to 10.0%, $C_2H_4$: 0.0 to 0.5%, $H_2$: remainder
  Reaction atmosphere pressure: 4.5 to 5.0 kPa
  Reaction atmosphere temperature: 650 to 850° C.
  Supply cycle: 4.00 to 30.00 seconds
  Gas supply time per cycle: 0.30 to 0.90 seconds
  Phase difference of supply of gas group A and gas group B: 0.10 to 0.30 seconds
  Phase difference of reaction gas (1) and reaction gas (2): 2.00 to 15.00 seconds In the coated tools 4 to 11 of the present invention, the lower layer and/or the upper layer shown in Table 5 were formed under film forming conditions shown in Table 4.

Further, for the purpose of comparison, by performing CVD on the surfaces of the tool bodies A to C under the conditions shown in Tables 2 and 3, a hard coating layer including a TiAlCN layer shown in Table 6 was vapor-deposited, and thus, comparative coated tools 1 to 11 were manufactured. For the comparative coated tools 4 to 11, the lower layer and/or the upper layer shown in Table 5 were formed according to the formation conditions shown in Table 4.

Further, for the hard coating layers of the coated tools 1 to 11 of the present invention and the comparative coated tools 1 to 11, the average content ratio $x_{avg}$ of Al and the average content ratio $y_{avg}$ of N were obtained using the above-mentioned method. In the area ratio of the crystal grains of the NaCl type face-centered cubic structure, the area ratio of the crystal grains having the aspect ratio A of 2 to 20, and each inclination angle frequency distribution formed by the normal of the plane {111}, the ratio of frequencies whose inclination angle was in the range of 0 to 12° was obtained. Further, the area ratio occupied by the crystal grains of the NaCl-type face-centered cubic structure of 0.01 μm<d≤0.20 μm in the upper layer side region of the TiAlCN layer, and the average value L (dsum) of the maximum length L in the direction parallel to the surface of the tool body were calculated. The results are summarized in Table 6.

In the average layer thickness, the vertical cross section (cross section in the direction perpendicular to the surface of the tool body) of each constituent layer of the coated tools 1 to 11 of the present invention and the comparative coated tools 1 to 11 was observed by selecting an appropriate magnification (for example, a magnification of 5,000 times) using a scanning electron microscope, layer thicknesses of the five points in an observation field were measured and averaged, and a region from the surface of the TiAlCN layer to half the length of the average layer thickness was defined as the upper layer side region.

TABLE 1

| Type | | Blending composition (mass %) | | | | | |
|---|---|---|---|---|---|---|---|
| | | Co | TiC | TaC | NbC | $Cr_3C_2$ | WC |
| Tool body | A | 6.0 | — | 0.4 | 0.6 | — | Remainder |
| | B | 8.5 | 1.1 | — | — | 0.3 | Remainder |
| | C | 10.0 | — | — | — | 1.0 | Remainder |

TABLE 2

| Formation of TiAlCN layer | | Gas composition of reaction gas (1) | | | | | | | | Reaction condition of reaction gas (1) Gas group A |
|---|---|---|---|---|---|---|---|---|---|---|
| Film formation type | Formation symbol | Reaction gas group A composition (volume %) | | | Reaction gas group B composition (volume %) | | | | | Supply cycle (seconds) |
| | | $NH_3$ | $N_2$ | $H_2$ | $AlCl_3$ | $TiCl_4$ | $N_2$ | $C_2H_4$ | $H_2$ | |
| Present invention step | A | 2.2 | 1.0 | 57 | 1.00 | 0.10 | 3.0 | 0.6 | Remainder | 8.50 |
| | B | 3.0 | 0.0 | 60 | 0.90 | 0.30 | 5.0 | 0.0 | Remainder | 4.00 |
| | C | 2.1 | 4.0 | 50 | 0.60 | 0.40 | 10.0 | 0.0 | Remainder | 11.00 |
| | D | 2.2 | 3.0 | 52 | 0.80 | 0.40 | 6.0 | 3.0 | Remainder | 21.00 |
| | E | 2.0 | 5.0 | 58 | 1.00 | 0.10 | 4.0 | 1.8 | Remainder | 15.00 |
| | F | 2.5 | 0.0 | 53 | 0.90 | 0.20 | 2.0 | 1.2 | Remainder | 30.00 |
| | G | 3.0 | 2.0 | 50 | 1.00 | 0.40 | 2.0 | 1.0 | Remainder | 10.00 |
| Comparative step | A' | 2.2 | 1.0 | 57 | 2.50 | 0.20 | 3.0 | 0.6 | Remainder | 3.00 |
| | B' | 5.0 | 1.0 | 48 | 0.90 | 0.30 | 11.0 | 0.0 | Remainder | 5.50 |
| | C' | 3.5 | 5.0 | 47 | 1.80 | 0.20 | 8.0 | 0.0 | Remainder | 45.00 |
| | D' | 2.2 | 3.0 | 52 | 0.40 | 0.40 | 6.0 | 3.0 | Remainder | 28.00 |
| | E' | 1.5 | 5.0 | 65 | 0.10 | 0.10 | 1.0 | 9.0 | Remainder | 3.00 |
| | F' | 3.0 | 0.0 | 23 | 0.20 | 0.30 | 1.0 | 1.2 | Remainder | 35.00 |
| | G' | 7.0 | 3.0 | 55 | 1.50 | 0.50 | 0.0 | 0.0 | Remainder | 7.00 |

| Formation of TiAlCN layer | | Reaction condition of reaction gas (1) | | | | | | |
|---|---|---|---|---|---|---|---|---|
| | | Gas group A | Gas group B | | Phase difference of supply of gas group A and gas group B | Reaction atmosphere | |
| Film formation type | Formation symbol | Supply time per cycle (seconds) | Supply cycle (seconds) | Supply time per cycle (seconds) | | Pressure (kPa) | Temperature (° C.) |
| Present invention step | A | 0.50 | 8.50 | 0.50 | 0.20 | 4.5 | 650 |
| | B | 0.40 | 4.00 | 0.40 | 0.15 | 4.6 | 750 |
| | C | 0.30 | 11.00 | 0.30 | 0.30 | 4.8 | 850 |
| | D | 0.70 | 21.00 | 0.70 | 0.27 | 5.0 | 700 |
| | E | 0.90 | 15.00 | 0.90 | 0.23 | 5.0 | 800 |
| | F | 0.60 | 30.00 | 0.60 | 0.10 | 4.5 | 800 |
| | G | 0.35 | 10.00 | 0.35 | 0.15 | 5.0 | 800 |
| Comparative step | A' | 0.50 | 3.00 | 0.50 | 0.20 | 7.0 | 950 |
| | B' | 0.30 | 5.50 | 0.30 | 0.15 | 3.5 | 800 |
| | C' | 0.80 | 45.00 | 0.80 | 0.40 | 4.8 | 850 |
| | D' | 0.60 | 28.00 | 0.60 | 0.27 | 5.0 | 700 |
| | E' | 0.20 | 3.00 | 0.20 | 0.10 | 2.0 | 700 |
| | F' | 1.00 | 35.00 | 1.00 | 0.50 | 3.8 | 600 |
| | G' | 0.30 | 7.00 | 0.30 | 0.10 | 5.0 | 850 |

TABLE 3

| Formation of TiAlCN layer | | Gas composition of reaction gas (2) | | | | | | | | Reaction condition of reaction gas (2) Gas group A |
|---|---|---|---|---|---|---|---|---|---|---|
| Film formation type | Formation symbol | Reaction gas group A composition (volume %) | | | Reaction gas group B composition (volume %) | | | | | Supply cycle (seconds) |
| | | $NH_3$ | $N_2$ | $H_2$ | $AlCl_3$ | $TiCl_4$ | $N_2$ | $C_2H_4$ | $H_2$ | |
| Present invention step | A | 0.4 | 5.0 | 60 | 0.20 | 0.01 | 6.0 | 0.1 | Remainder | 8.50 |
| | B | 0.6 | 4.0 | 51 | 0.15 | 0.06 | 4.0 | 0.0 | Remainder | 4.00 |
| | C | 0.2 | 0.0 | 50 | 0.06 | 0.06 | 7.0 | 0.0 | Remainder | 11.00 |
| | D | 0.3 | 1.0 | 55 | 0.16 | 0.02 | 2.0 | 0.5 | Remainder | 21.00 |
| | E | 0.2 | 2.0 | 56 | 0.20 | 0.04 | 10.0 | 0.3 | Remainder | 15.00 |
| | F | 0.5 | 3.0 | 57 | 0.16 | 0.03 | 5.0 | 0.2 | Remainder | 30.00 |
| | G | 0.6 | 0.0 | 50 | 0.06 | 0.01 | 2.0 | 0.1 | Remainder | 10.00 |
| Comparative step | A' | 0.4 | 5.0 | 48 | 0.40 | 0.02 | 12.0 | 0.1 | Remainder | 3.00 |
| | B' | 2.0 | 3.0 | 66 | 0.20 | 0.04 | 3.0 | 0.0 | Remainder | 5.50 |
| | C' | 0.3 | 0.0 | 55 | 0.08 | 0.02 | 2.0 | 0.0 | Remainder | 45.00 |
| | D' | 0.3 | 6.0 | 34 | 0.04 | 0.04 | 2.0 | 0.5 | Remainder | 28.00 |
| | E' | 0.8 | 2.0 | 65 | 0.20 | 0.04 | 15.0 | 1.5 | Remainder | 3.00 |
| | F' | 1.0 | 4.0 | 54 | 0.20 | 0.01 | 4.0 | 0.2 | Remainder | 35.00 |
| | G' | 3.0 | 1.0 | 40 | 0.03 | 0.01 | 0.0 | 0.0 | Remainder | 7.00 |

| Formation of TiAlCN layer | | Reaction condition of reaction gas (2) | | | | | Phase difference of reaction gas (1) and reaction gas (2) |
|---|---|---|---|---|---|---|---|
| Film formation type | Formation symbol | Gas group A Supply time per cycle (seconds) | Gas group B Supply time per cycle (seconds) | Phase difference of supply of gas group A and gas group B (seconds) | Reaction atmosphere Pressure (kPa) | Reaction atmosphere Temperature (° C.) | |
| Present invention step | A | 0.50 | 8.50 | 0.50 | 0.20 | 4.5 | 650 | 4.25 |
| | B | 0.40 | 4.00 | 0.40 | 0.15 | 4.6 | 750 | 2.00 |
| | C | 0.30 | 11.00 | 0.30 | 0.30 | 4.8 | 850 | 5.50 |
| | D | 0.70 | 21.00 | 0.70 | 0.27 | 5.0 | 700 | 10.50 |
| | E | 0.90 | 15.00 | 0.90 | 0.23 | 5.0 | 800 | 7.50 |
| | F | 0.60 | 30.00 | 0.60 | 0.10 | 4.5 | 800 | 15.00 |
| | G | 0.35 | 10.00 | 0.35 | 0.15 | 5.0 | 800 | 5.00 |
| Comparative step | A' | 0.50 | 3.00 | 0.50 | 0.20 | 7.0 | 950 | 1.50 |
| | B' | 0.30 | 5.50 | 0.30 | 0.15 | 3.5 | 800 | 2.25 |
| | C' | 0.80 | 45.00 | 0.80 | 0.40 | 4.8 | 850 | 22.50 |
| | D' | 0.60 | 28.00 | 0.60 | 0.27 | 5.0 | 700 | 14.00 |
| | E' | 0.20 | 3.00 | 0.20 | 0.10 | 2.0 | 700 | 1.50 |
| | F' | 1.00 | 35.00 | 1.00 | 0.50 | 3.8 | 600 | 17.50 |
| | G' | 0.30 | 7.00 | 0.30 | 0.10 | 5.0 | 850 | 3.50 |

TABLE 4

| Constituent layer of hard coating layer | | | Formation condition (pressure of reaction atmosphere indicates kPa and temperature indicates ° C.) | | |
|---|---|---|---|---|---|
| Type | | Formation symbol | Reaction gas composition (volume %) | Reaction atmosphere Pressure | Reaction atmosphere temperature |
| TiAlCN layer | TiAlCN | TiAlCN | Refer to tables 2 and 3 | Refer to tables 2 and 3 | |
| Ti compound layer | TiN | TiN | $TiCl_4$: 4.2%, $N_2$: 30.0%, $H_2$: remainder | 7.0 | 800 |
| | TiCN | TiCN | $TiCl_4$: 2.0%, $CH_3CN$: 0.7%, $N_2$: 10.0%, $H_2$: remainder | 7.0 | 800 |
| | TiCNO | TiCNO | $TiCl_4$: 2.0%, $CH_3CN$: 0.7%, CO: 1.0%, $N_2$: 10.0%, $H_2$: remainder | 7.0 | 800 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: remainder | 7.0 | 900 |

TABLE 5

| Type | Tool body symbol | Hard coating layers (lower numerical value indicates average layer thickness (μm) of layer) | | | |
|---|---|---|---|---|---|
| | | Lower layers | | Upper layers | |
| | | First layer | Second layer | First layer | Second layer |
| Present invention coated tool | 1 A | — | — | — | — |
| | 2 B | — | — | — | — |
| | 3 C | — | — | — | — |
| Comparative coated tool | 4 A | TiN (0.1) | — | — | — |
| | 5 B | TiN (0.3) | TiCN (5.0) | TiCNO (0.3) | Al$_2$O$_3$ (1.0) |
| | 6 C | TiN (0.5) | TiCN (3.0) | — | — |
| | 7 A | — | — | Al$_2$O$_3$ (2.0) | — |
| | 8 B | TiN (1.0) | TiCN (3.0) | TiCNO (0.2) | Al$_2$O$_3$ (1.5) |
| | 9 C | TiN (0.5) | TiCN (2.0) | Al$_2$O$_3$ (3.0) | — |
| | 10 A | TiN (0.3) | TiCN (3.0) | TiCNO (0.3) | Al$_2$O$_3$ (3.0) |
| | 11 B | TiN (0.5) | — | TiCNO (0.3) | Al$_2$O$_3$ (1.5) |

TABLE 6

| Type | TiAlCN formation symbol | TiAlCN composition (atomic ratio) $x_{avg}$ | TiAlCN composition (atomic ratio) $y_{avg}$ | Average layer thickness (μm) | Area ratio of NaCl-type face-centered cubic structure (%) | Area ratio of crystal grains of 0.01 μm < d ≤ 0.20 μm (%) | Average value L (dsum) of maximum length of each region formed by crystal grains of 0.01 μm < d ≤ 0.20 μm (μm) | Area ratio of crystal grains of aspect ratio A (2 to 20) (%) | Does highest peak exist in inclination angle division in range of 0° to 12° | Ratio of frequencies existing in range of 0° to 12° in inclination angle distribution with respect to normal of plane {111} |
|---|---|---|---|---|---|---|---|---|---|---|
| Present invention coated tool | 1 A | 0.95 | 0.01 | 5.3 | 90 | 32 | 3.2 | 25 | X | 38 |
| | 2 B | 0.74 | 0.00 | 6.4 | 93 | 28 | 2.4 | 28 | X | 25 |
| | 3 C | 0.60 | 0.00 | 2.0 | 100 | 10 | 1.0 | 15 | ○ | 45 |
| | 4 D | 0.69 | 0.05 | 10.0 | 92 | 17 | 1.7 | 78 | ○ | 55 |
| | 5 E | 0.89 | 0.03 | 2.5 | 97 | 40 | 5.0 | 35 | ○ | 68 |
| | 6 F | 0.83 | 0.02 | 4.5 | 96 | 33 | 4.3 | 55 | ○ | 35 |
| | 7 A | 0.94 | 0.01 | 6.0 | 92 | 29 | 3.1 | 24 | X | 37 |
| | 8 B | 0.75 | 0.00 | 4.3 | 91 | 34 | 2.3 | 22 | X | 23 |
| | 9 C | 0.62 | 0.00 | 2.5 | 100 | 13 | 1.4 | 19 | ○ | 50 |
| | 10 D | 0.70 | 0.05 | 5.0 | 93 | 15 | 1.5 | 72 | ○ | 51 |
| | 11 G | 0.72 | 0.04 | 6.0 | 90 | 10 | 0.2 | 90 | ○ | 90 |
| Comparative coated tool | 1 A' | 0.98 | 0.00 | 4.3 | (Only hexagonal crystal) | | | | | |
| | 2 B' | 0.78 | 0.01 | 6.7 | 63 | 35 | 4.3 | 28 | X | 20 |
| | 3 C' | 0.96 | 0.00 | 2.0 | 76 | 22 | 1.2 | 57 | ○ | 21 |
| | 4 D' | 0.55 | 0.07 | 10.0 | 98 | 15 | 1.7 | 12 | ○ | 51 |
| | 5 E' | 0.67 | 0.09 | 2.5 | 100 | 45 | 4.7 | 15 | X | 15 |
| | 6 F' | 0.69 | 0.01 | 4.5 | 97 | 39 | 6.8 | 10 | X | 12 |
| | 7 A' | 0.97 | 0.00 | 6.0 | (Only hexagonal crystal) | | | | | |
| | 8 B' | 0.77 | 0.01 | 4.3 | 63 | 35 | 4.3 | 32 | X | 18 |
| | 9 C' | 0.96 | 0.00 | 2.5 | 76 | 22 | 1.2 | 65 | ○ | 22 |
| | 10 D' | 0.57 | 0.06 | 5.0 | 98 | 15 | 1.7 | 13 | ○ | 53 |
| | 11 G' | 0.75 | 0.00 | 3.0 | 90 | 2 | 0.2 | 95 | ○ | 88 |

○: Highest peak is present
X: Highest peak is not present

Subsequently, in a state where each of the coated tools 1 to 11 of the present invention and the comparative coated tools 1 to 11 was clamped to a distal portion of a tool steel cutter having a cutter diameter of 100 mm using a fixing jig, dry high-speed face milling and center-cut cutting test of alloy steel shown below was carried out, and a flank wear width of a cutting edge was measured. Table 7 shows the results of the cutting test. Since the comparative coated tools 1 to 11 have reached the end of their life due to occurrence of chipping, a time until the end of their life is shown.

Cutting test 1: Dry high-speed face milling and center cut cutting test
Cutter diameter: 100 mm
Work material: JIS/SCM440 Block material with a width of 80 mm and a length of 400 mm
Rotation speed: 1114 min$^{-1}$
Cutting speed: 350 m/min
Depth of cut: 3.0 mm
Feed: 0.3 mm/tooth
Cutting time: 8 minutes
(Normal cutting speed is 200 m/min)

TABLE 7

| Type | | Flank wear width (mm) | Type | | *: cutting time until end of life (minutes) |
|---|---|---|---|---|---|
| Present invention coated tool | 1 | 0.19 | Comparative coated tool | 1 | 3.2 |
| | 2 | 0.16 | | 2 | 5.6 |
| | 3 | 0.14 | | 3 | 6.9 |
| | 4 | 0.12 | | 4 | 5.8 |
| | 5 | 0.08 | | 5 | 7.2 |
| | 6 | 0.09 | | 6 | 6.0 |
| | 7 | 0.17 | | 7 | 3.7 |
| | 8 | 0.15 | | 8 | 5.3 |
| | 9 | 0.14 | | 9 | 7.5 |
| | 10 | 0.12 | | 10 | 6.2 |
| | 11 | 0.08 | | 11 | 7.8 |

Cutting time (minutes) until end of life of comparative coated tool indicates cutting time (minutes) until reaching end of life due to occurrence of chipping Example 2

WC powder, TiC powder, ZrC powder, TaC powder, NbC powder, $Cr_3C_2$ powder, TiN powder, and Co powder, each having an average grain size of 1 to 3 μm, were prepared as raw material powders, these raw material powders were blended into a blending composition shown in Table 8, wax was further added to the raw material powders, and the powders were mixed in a ball mill in acetone for 24 hours and dried under reduced pressure. Then, the powders were press-molded into a green compact of a predetermined shape at a pressure of 98 MPa, this green compact was vacuum sintered in a vacuum of 5 Pa at a predetermined temperature in a range of 1370 to 1470° C. for 1 hour. After sintering, cutting edge portion was honed with an R: 0.07 mm to manufacture WC-based cemented carbide tool bodies a to y having an insert shape of ISO standard CNMG120412.

Next, a TiAlCN layer was formed on the surfaces of the tool bodies a to y by the same method as in Example 1 under the conditions shown in Tables 2 and 3, using a CVD apparatus, and coated tools 12 to 22 of the present invention shown in Table 10 were obtained.

In the coated tools 15 to 20 and 22 of the present invention, the lower layer and/or the upper layer shown in Table 9 were formed under the film forming conditions shown in Table 4.

Further, as in Example 1, for the purpose of comparison, by performing CVD on the surfaces of the tool bodies a to y using a CVD method under the conditions shown in Tables 2 and 3, a hard coating layer including a TiAlCN layer shown in Table 10 was vapor-deposited, and thus, comparative coated tools 12 to 22 were manufactured.

For the comparative coated tools 15 to 20 and 22, the lower layer and/or the upper layer shown in Table 9 were formed according to the formation conditions shown in Table 4.

Further, in the same manner as in Example 1, for the hard coating layers of the coated tools 12 to 22 of the present invention and the comparative coated tools 12 to 22, the average content ratio $x_{avg}$ of Al and the average content ratio $y_{avg}$ of N were obtained using the above-mentioned method. In the area ratio of the crystal grains of the NaCl type face-centered cubic structure, the area ratio of the crystal grains having the aspect ratio A of 2 to 20, and each inclination angle frequency distribution formed by the normal of the plane {111}, the ratio of frequencies whose inclination angle was in the range of 0 to 12° was obtained. Further, the area ratio with respect to by the crystal grains of the NaCl-type face-centered cubic structure of 0.01 μm<d≤0.20 μm in the region on the upper layer side of the TiAlCN layer, and the average value L (dsum) of the maximum length L in the direction parallel to the surface of the tool body were obtained. These results are summarized in Table 10.

The average layer thickness and the region on the upper layer side were the same as in Example 1.

TABLE 8

| | | Bending composition (mass %) | | | | | | | |
|---|---|---|---|---|---|---|---|---|---|
| Type | | Co | TiC | ZrC | TaC | NbC | $Cr_3C_2$ | TiN | WC |
| Tool body | α | 6.5 | — | 1.5 | — | 2.5 | 0.1 | 1.5 | Remaining |
| | β | 7.5 | 2.4 | — | 4.0 | 0.5 | — | 1.0 | Remaining |
| | γ | 6.0 | — | — | — | — | — | — | Remaining |

TABLE 9

| | | | Hard coating layer (lower numerical value indicate average layer thickness (μm) of layer) | | | |
|---|---|---|---|---|---|---|
| | | | Lower layer | | Upper layer | |
| Type | | Tool body symbol | First layer | Second layer | First layer | Second layer |
| Present invention coated tool | 12 | α | — | — | — | — |
| | 13 | β | — | — | — | — |
| | 14 | γ | — | — | — | — |
| Comparative coated tool | 15 | α | TiN (2.0) | — | — | — |
| | 16 | β | TiN (0.5) | TiCN (5.0) | — | $Al_2O_3$ (5.0) |
| | 17 | γ | TiN (1.0) | TiCN (7.0) | TiCNO (0.3) | $Al_2O_3$ (3.0) |
| | 18 | α | — | — | TiCNO (0.5) | $Al_2O_3$ (25.0) |
| | 19 | β | TiN (1.0) | TiCN (7.0) | TiCNO (0.5) | $Al_2O_3$ (7.0) |
| | 20 | γ | TiN (0.5) | TiCN (20.0) | $Al_2O_3$ (3.0) | — |
| | 21 | α | — | — | — | — |
| | 22 | β | TiN (0.5) | TiCN (7.0) | TiCNO (0.3) | $Al_2O_3$ (5.0) |

TABLE 10

| Type | TiAlCN formation symbol | TiAlCN composition (atomic ratio) $x_{avg}$ | TiAlCN composition (atomic ratio) $y_{avg}$ | Average layer thickness (μm) | Area ratio of NaCl-type face-centered cubic structure (%) | Area ratio of crystal grains of 0.01 μm < d ≤ 0.20 μm (%) | Average value L (dsum) of maximum length of each region formed by crystal grains of 0.01 μm < d ≤ 0.20 μm (mm) | Area ratio of crystal grains of aspect ratio A (2 to 20) (%) | Does highest peak exist in inclination angle division in range of 0° to 12 | Ratio of frequencies existing in range of 0° to 12° in inclination angle distribution with respect to normal of plane {111} |
|---|---|---|---|---|---|---|---|---|---|---|
| Present invention coated tool | 12 A | 0.93 | 0.01 | 10.4 | 90 | 28 | 3.3 | 28 | X | 35 |
| | 13 B | 0.77 | 0.00 | 11.6 | 93 | 24 | 2.6 | 27 | X | 22 |
| | 14 C | 0.61 | 0.00 | 15.5 | 100 | 12 | 1.3 | 16 | ○ | 47 |
| | 15 D | 0.68 | 0.03 | 8.0 | 93 | 14 | 1.8 | 75 | ○ | 58 |
| | 16 E | 0.87 | 0.02 | 5.3 | 98 | 38 | 4.8 | 33 | ○ | 66 |
| | 17 F | 0.85 | 0.01 | 4.5 | 97 | 36 | 4.1 | 57 | ○ | 31 |
| | 18 A | 0.94 | 0.01 | 2.3 | 91 | 27 | 3.0 | 26 | X | 35 |
| | 19 B | 0.76 | 0.00 | 5.1 | 92 | 36 | 2.2 | 23 | X | 23 |
| | 20 C | 0.62 | 0.00 | 3.2 | 100 | 15 | 1.3 | 17 | ○ | 48 |
| | 21 D | 0.71 | 0.03 | 20.0 | 95 | 14 | 1.8 | 74 | ○ | 51 |
| | 22 G | 0.73 | 0.04 | 12.0 | 93 | 13 | 0.2 | 90 | ○ | 88 |
| Comparative coated tool | 12 A' | 0.97 | 0.00 | 15.0 | (Only hexagonal crystal) | | | | | |
| | 13 B' | 0.76 | 0.01 | 10.0 | 62 | 42 | 4.6 | 26 | X | 18 |
| | 14 C' | 0.97 | 0.00 | 4.0 | 75 | 26 | 1.4 | 58 | ○ | 24 |
| | 15 D' | 0.56 | 0.07 | 14.0 | 99 | 9 | 1.8 | 14 | ○ | 50 |
| | 16 E' | 0.66 | 0.09 | 2.5 | 100 | 50 | 5.1 | 16 | X | 17 |
| | 17 F' | 0.70 | 0.01 | 20.0 | 97 | 43 | 6.4 | 11 | X | 14 |
| | 18 A' | 0.98 | 0.00 | 12.0 | (Only hexagonal crystal) | | | | | |
| | 19 B' | 0.78 | 0.01 | 4.0 | 63 | 38 | 4.3 | 31 | X | 23 |
| | 20 C' | 0.96 | 0.00 | 15.0 | 77 | 27 | 1.4 | 65 | ○ | 28 |
| | 21 D' | 0.58 | 0.07 | 25.0 | 97 | 19 | 1.7 | 13 | ○ | 62 |
| | 22 G' | 0.74 | 0.00 | 7.0 | 92 | 1 | 0.1 | 95 | ○ | 85 |

○: Highest peak is present
X: Highest peak is not present

Next, in a state where each of the above-mentioned various coated tools was screwed to a distal portion of the tool steel bite with a fixing jig, a dry intermittent cutting test shown below was performed on the coated tools 12 to 22 of the present invention and the comparative coated tools 12 to 22, and a flank wear width of a cutting edge was measured. The evaluation results are shown in Table 11. Since the comparative coated tools 12 to 22 have reached the end of their life due to occurrence of chipping, a time until the end of their life is shown.

Cutting test: Dry high-speed intermittent cutting
Work material: JIS/FCD600 Round bar with 8 vertical grooves at equal intervals in length direction
Cutting speed: 300 m/min
Depth of cut: 3.0 mm
Feed: 0.3 mm/rev
Cutting time: 5 minutes
(Normal cutting speed is 200 m/min)

TABLE 11

| Type | | Flank wear width (mm) | Type | | *: cutting time until end of life (minutes) |
|---|---|---|---|---|---|
| Present invention coated tool | 12 | 0.19 | Comparative coated tool | 12 | 2.1 |
| | 13 | 0.17 | | 13 | 3.1 |
| | 14 | 0.14 | | 14 | 4.0 |
| | 15 | 0.11 | | 15 | 2.9 |
| | 16 | 0.08 | | 16 | 4.5 |
| | 17 | 0.10 | | 17 | 3.2 |
| | 18 | 0.17 | | 18 | 2.5 |
| | 19 | 0.16 | | 19 | 2.2 |
| | 20 | 0.13 | | 20 | 4.3 |
| | 21 | 0.13 | | 21 | 3.7 |
| | 22 | 0.09 | | 22 | 4.7 |

Cutting time (minutes) until end of life of comparative coated tool indicates cutting time (minutes) until reaching end of life due to occurrence of chipping From the results shown in Tables 7 and 11, in all of the coated tools 1 to 22 of the present invention, the hard coating layer has excellent chipping resistance. Accordingly, even when the coated tools 1 to 22 of the present invention are used for high-speed intermittent cutting of cast iron, alloy steel, or the like, the chipping does not occur, and excellent wear resistance is exhibited for a long period of time. On the other hand, the comparative coated tools 1 to 22 which do not satisfy even one of the matters specified in the coated tool of the present invention cause chipping when used for high-speed intermittent cutting of cast iron, alloy steel, or the like, and has reached the end of useful lives thereof in a short time.

INDUSTRIAL APPLICABILITY

As described above, the coated tool of the present invention can be used as a coated tool for high-speed intermittent cutting of cast iron, alloy steel, or the like, and yet exhibits excellent wear resistance over a long period of time. Therefore, it is possible to fully satisfy high performance of a machine tool, labor saving and energy saving of cutting, and cost reduction.

What is claimed is:

1. A surface coated cutting tool comprising:
a tool body; and
a hard coating layer provided on a surface of the tool body, wherein
(a) the hard coating layer includes at least a complex nitride layer or a complex carbonitride layer of Ti and Al having an average layer thickness of 2.0 to 20.0 µm,
(b) when the complex nitride layer or the complex carbonitride layer is represented by a composition formula: $(Ti_{(1-x)}Al_x)(C_yN_{(1-y)})$, an average content ratio $x_{avg}$ of Al with respect to a total amount of Ti and Al and an average content ratio $y_{avg}$ of C with respect to a total amount of C and N (where, each of $x_{avg}$ and $y_{avg}$ is an atomic ratio) each satisfy $0.60 \leq x_{avg} \leq 0.95$ and $0.00 \leq y_{avg} \leq 0.05$,
(c) when observing a vertical cross section of each of the complex nitride layer or the complex carbonitride layer, an area ratio occupied by crystal grains having an NaCl-type face-centered cubic structure of a complex nitride or a complex carbonitride satisfies 90 area % or more,
(d) when the complex nitride layer or the complex carbonitride layer is bisected into an upper layer side and a lower layer side in a layer thickness direction, in a region on the upper layer side, in a case where a crystal grain size d of each of the crystal grains having the NaCl-type face-centered cubic structure is obtained, crystal grains having the crystal grain size d of 0.01 µm<d≤0.20 µm exist in an area ratio of 10 to 40 area % with respect to an entire area of the complex nitride layer or the complex carbonitride layer in the region on the upper layer side, and
(e) in the region on the bisected upper layer side, an average value L(dsum) of a maximum length L in a direction parallel to the surface of the tool body in each region in which the crystal grains having the NaCl-type face-centered cubic structure and each crystal grain size d of 0.01 µm<d≤0.20 µm are adjacent and connected to each other satisfies L(dsum)≤5.0 µm.

2. The surface coated cutting tool according to claim 1, wherein in the complex nitride layer or the complex carbonitride layer, the area ratio occupied by the crystal grains having the NaCl-type face-centered cubic structure is 95 area % or more.

3. The surface coated cutting tool according to claim 1, wherein among the crystal grains constituting the complex nitride layer or the complex carbonitride layer, in crystal grains having the NaCl-type face-centered cubic structure and each crystal grain size d of 0.20 µm<d, crystal grains having an aspect ratio A of 2 to 20 exist in an area ratio of 30 area % or more with respect to the entire area of the complex nitride layer or the complex carbonitride layer.

4. The surface coated cutting tool according to claim 1, wherein when an inclination angle frequency distribution is obtained by measuring an inclination angle between a normal of a plane {111} of the crystal grain having the NaCl-type face-centered cubic structure among the crystal grains constituting the complex nitride layer or the complex carbonitride layer and a direction perpendicular to the surface of the tool body, a highest peak exists in an inclination angle division in a range of 0° to 12° and a total of frequencies existing in the range of 0° to 12° is 45% or more of total frequencies in the inclination angle frequency distribution.

* * * * *